US005610559A

United States Patent [19]
Dent

[11] Patent Number: 5,610,559
[45] Date of Patent: Mar. 11, 1997

[54] DUAL LOOP FREQUENCY SYNTHESIZER HAVING FRACTIONAL DIVIDERS

[75] Inventor: Paul W. Dent, Stehags, Sweden

[73] Assignee: Ericsson Inc., Research Triangle Park, N.C.

[21] Appl. No.: 614,722

[22] Filed: Mar. 13, 1996

Related U.S. Application Data

[62] Division of Ser. No. 305,780, Sep. 14, 1994, Pat. No. 5,535,432.

[51] Int. Cl.$^6$ ........................................ H03L 7/23
[52] U.S. Cl. .................. 331/2; 331/25; 455/76; 455/260
[58] Field of Search .................. 331/2, 25; 375/376; 455/76, 260

[56] References Cited

U.S. PATENT DOCUMENTS

| | | | |
|---|---|---|---|
| 4,234,929 | 11/1980 | Riley, Jr. | 364/701 |
| 4,963,838 | 10/1990 | Hareyama | 331/2 |
| 4,994,762 | 2/1991 | Tay | 331/2 |
| 5,048,059 | 9/1991 | Dent | 375/94 |
| 5,073,900 | 12/1991 | Mallinckrodt | 375/1 |
| 5,095,288 | 3/1992 | Dent | 331/17 |
| 5,111,162 | 5/1992 | Hietala et al. | 332/127 |
| 5,129,095 | 7/1992 | Davis et al. | 455/12.1 |
| 5,180,993 | 1/1993 | Dent | 331/16 |
| 5,187,805 | 2/1993 | Bertiger et al. | 455/12.1 |
| 5,289,506 | 2/1994 | Kitayama et al. | 375/97 |

FOREIGN PATENT DOCUMENTS 536921 4/1993 European Pat. Off. .

OTHER PUBLICATIONS

F. D. Priscoli et al., "Study on the Integration between the GSM Cellular Network and a Satellite System," *IEEE Telecommunications Conference*, vol. 1/4, 29, Nov. 1993.

*Primary Examiner*—Siegfried H. Grimm
*Attorney, Agent, or Firm*—Burns, Doane, Swecker & Mathis, L.L.P.

[57] ABSTRACT

A radio telephone which is capable of switching between operating through a land based cellular network and an orbiting satellite system is disclosed. First antenna and radio frequency circuits receive transmitted signals from the land-based network and form first conditioned Signals for subsequent numerical decoding. Second antenna and radio frequency circuits receive transmitted signals from the orbiting satellite system and form second conditioned signals for subsequent numerical decoding. Numerical decoders process either the first conditioned signals or the second conditioned signals to provide an automatic frequency control signal. Reference frequency oscillators controlled by the automatic frequency control signal provide a reference frequency signal. Radio frequency synthesizers using the reference frequency signal and having a first output at a first programmable frequency connected to the first radio frequency circuits determine reception of a channel frequency of the land-based network and a second output at a second programmable frequency connected to the second radio frequency circuits determine reception of a channel frequency of the orbiting satellite system.

14 Claims, 4 Drawing Sheets

DUAL LOOP FREQUENCY SYNTHESIZER HAVING FRACTIONAL DIVIDERS

This application is a divisional of application Ser. No. 08/305,780, filed Sep. 14, 1994 and now U. S. Pat. No. 5,535,432.

Present invention relates to mobile or portable telephones that can operate either through land-based cellular systems or through orbiting satellites, and more particularly to a dual mode satellite/cellular telephone with a frequency synthesizer that can provide both wide and narrow channel spacing.

BACKGROUND OF THE INVENTION

In satellite/cellular systems, the signal bandwidth and channel spacing used in the satellite mode is considerably different from the signal bandwidth used in the cellular mode. For example, the GSM cellular system has a channel spacing of 200 KHz, while a satellite system may use a channel spacing of 5 KHz. In the narrow band mode, frequency and phase noise is considerably more troublesome than in the wideband mode. As a result, difficulties can arise in attempting to design re-used patterns for both modes. In analog cellular telephones such as the ones designed for the U.S. AMPS system, for example, conventional single-loop digital frequency synthesizers can be employed. In such cellular phones, the channel spacing is 30 KHz and there are no requirements for extremely fast channel changing. In the pan-European digital cellular system GSM, frequency hopping is employed to mitigate the effects of slow fading. Fast frequency switching synthesizers are then needed, but since the channel steps of 200 KHz are relatively coarse, the switching speed can be achieved by conventional techniques.

However, in the U.S. digital cellular system IS54, the channel spacing is the same as the channel spacing in the AMPS system at 30 KHz, but a requirement for fast frequency changing arises in order to permit mobile phones to scan the frequencies of surrounding base stations during short idle periods. U.S. patent application Ser. No. 07/804,609 which is commonly assigned and now U. S. Pat. No. 5,180,993, describes techniques that can be employed to assist in meeting this fast frequency changing requirement and is incorporated herein by reference. One of the techniques disclosed is called "fractional-N" which is a way to obtain free frequency steps while keeping the phase comparison frequency at which the loop phase error detector operates relatively high. This is desirable when fast switching and low phase noise must be achieved.

In "Phaselock techniques" by Floyd M. Gardener, Wiley 1979, Gardener a dual-loop synthesizer called "vernier loop" is illustrated which permits the generation of small frequency steps while keeping the phase comparison frequency of both loops high. This prior technique is an alternative technique for achieving small frequency steps, fast switching and low phase noise. Using the vernier loop technique alone, narrow channel spaced modes may be obtained in one frequency band. However, the larger frequency band with fast switching as required in the cellular band can not be obtained. Consequently, one embodiment of the present invention comprises an improved vernier loop synthesizer in which at least one loop is a fractional-N loop providing cellular frequency spacing.

SUMMARY OF THE INVENTION

An object of the present invention is to combine both fractional and vernier loop techniques so as to surpass the performance of either technique performed alone. In addition, it is an object of the present invention to provide a synthesizer which provides both a first output at a first frequency having fine or small steps suitable for satellite communications and a second output at a second frequency having coarse steps suitable for use in a cellular system.

Present invention discloses a radio telephone device which is capable of switching between operating through a land based cellular network and an orbiting satellite system. The radio telephone comprises a first antenna and radio frequency means for receiving transmitted signals from a land based network and transforms the received signals into a form for subsequent numerical decoding. The radio telephone also includes a second antenna and radio frequency means for receiving transmitted signals from the orbiting satellite system and forming signals for subsequent numerical decoding. Numerical decoding means is also provided for processing either first condition signals or second condition signals to provide an automatic frequency control signal (AFC). Reference frequency oscillator means controlled by the AFC signal provides an accurate reference frequency signal. A radio frequency synthesizer means is also disclosed which uses the accurate reference frequency signal and has a first output at a first programmable frequency connected to the first radio frequency means to determine reception on a channel frequency of the land based network. The radio frequency synthesizer also has a second output at a second programmable frequency connected to the second radio frequency means to determine reception on a channel frequency of the orbiting satellite system.

BRIEF DESCRIPTION OF THE DRAWINGS

These and other features and advantages of the invention will be readily apparent to one of ordinary skill in the art from the following written description, used in conjunction with the drawings, in which.

DETAILED DESCRIPTION OF THE PREFERRED EMBODIMENTS

The present invention is directed toward a dual mode satellite/cellular telephone with a frequency synthesizer that can provide both wide and narrow channel spacing. The present invention is described in connection with the GSM cellular system but is not limited thereto. It would be understood by one skilled in the art that the present invention also pertains to other cellular systems.

Figure 1:
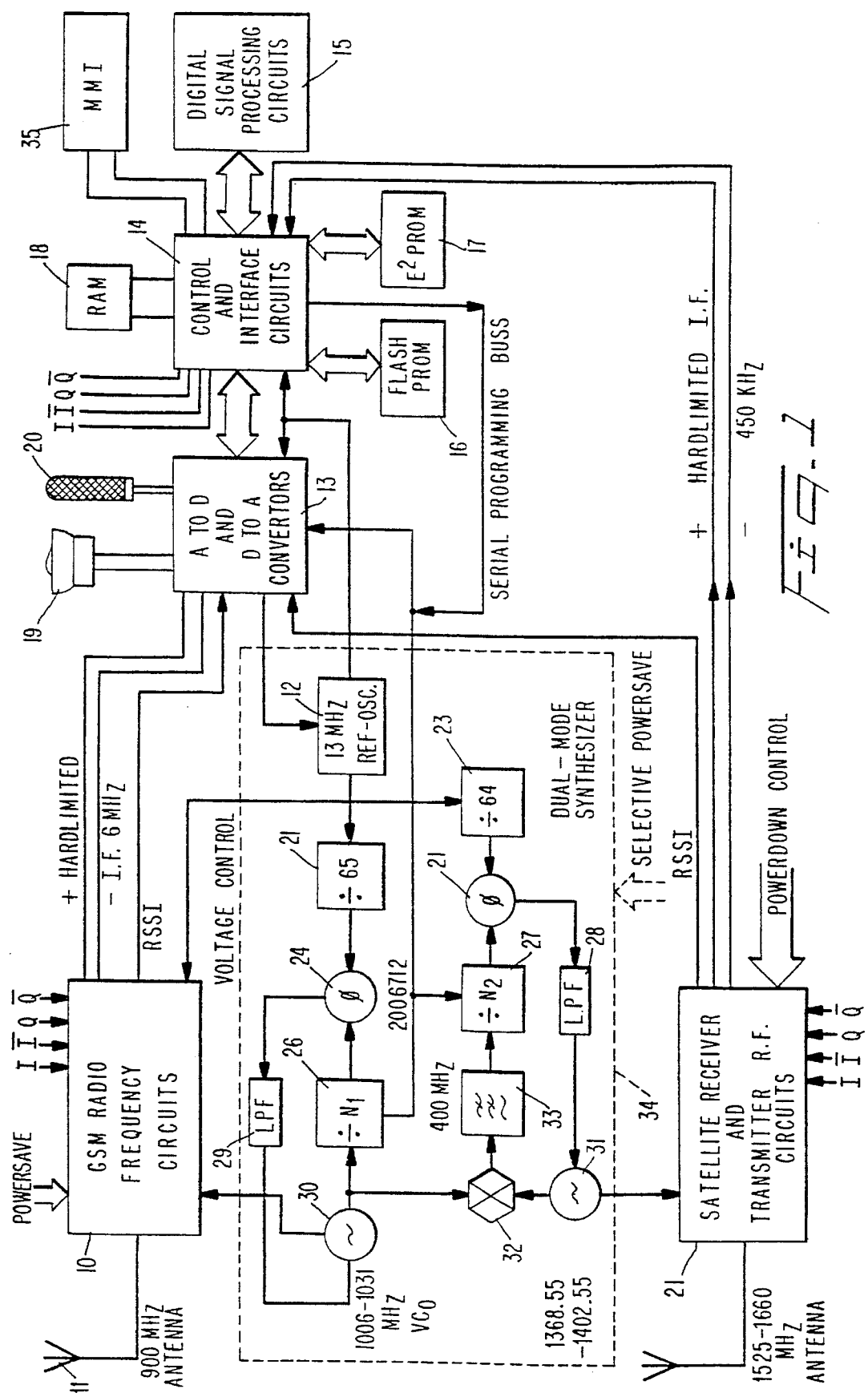
FIG. 1 illustrates a dual mode satellite/cellular phone according to one embodiment of the present invention.

A block diagram of a satellite/cellular portable telephone according to one embodiment of the present invention is illustrated in FIG. 1. A GSM transmitter/receiver RF circuit 10 is connected to a 900 MHz cellular antenna 11. A dual-mode synthesizer 34 supplies a local oscillator signal to the GSM circuits in the range of 1006–1031 MHz in 200 KHz steps. The 200 KHz steps are derived by dividing the output of a 13 MHz frequency oscillator 12 by 65 in divider 22. The phase detector 24 then compares this reference 200 KHz signal with the output of a Voltage Control Oscillator 30 which is divided by a variable integer N1 in divider 26. The phase error from the phase detector 24 is filtered in loop filter 29 and then applied to control the VCO 30 such that its frequency is N1 times 200 KHz.

The GSM receiver part of the transmitter/receiver is illustrated in circuit 10. In this embodiment, the received signals are first converted into a first intermediate frequency (IF) of 71 MHz by mixing the received signals with the synthesized local oscillator frequency and then to a second intermediate frequency of 6 MHz by mixing with 65 MHz which is five times the 13 MHz reference signal. The second IF signal is hardlimited and processed to extract an RSSI signal which is approximately proportional to the logarithm of the amplitude of the second IF signal. The hardlimited IF signal is processed in an AtoD convertor 13 to extract numerical values related to the instantaneous signal phase, for example, COS(PHI) and SIN(PHI). These values are then combined with the result of the analog-to-digital converted RSSI signal. The combined signals are transferred via a control and interface circuit 14 to digital signal processing circuits 15. This method for digitizing a radio signal is disclosed in U.S. Pat. No. 5,048,059 which is commonly assigned and hereby incorporated by reference. The signal is then processed to form PCM voice samples which are transferred back from the digital signal processing circuits 15 to the DtoA convertor 13 via the control and interface circuits 14. The DtoA convertor then transfers the PCM voice samples to an earpiece 19.

In the cellular transmit direction, a microphone 20 supplies voice signals to the DtoA convertor 13 where the voice signals are digitized and transferred via the control and interface circuits 14 to digital signal processing circuits 15 for coding. The coding reduces the bitrate for transmission and the reduced bitrate signals are transferred back through the control and interface circuit 14 where the signals are converted to I,Ī,Q,Q̄ modulating signals. The modulating signals are then fed to the GSM transmitter section of the circuit 10 where they are converted into the 890–915 MHz range for transmission via an intermediate frequency of 117 MHz, which is nine times the 13 MHz reference frequency.

The control and interface circuits 14 also contains a microprocessor coupled to a RAM 18, a flash program memory 16, and an EEPROM 17, as well as to a man-machine interface 35 which may, for example, be a keypad and display.

When the telephone is in the GSM mode, the satellite communication circuits 21 are powered down by control signals from the control and interface circuits 14 to save power. Unused parts of the dual-mode synthesizer such as VCO 31 are also powered down to save power. Many other battery-power saving features can also be incorporated, and in particular, the phone when in the standby mode can be powered down for most of the time and only wake up at predetermined instances to read messages transmitted by GSM base stations in the phone's allocated paging time slot.

According to one embodiment of the present invention, when a phone in the idle mode detects that all GSM base stations are becoming weaker, the phone uses the idle time between GSM waking periods to activate the satellite circuits to search for a satellite calling channel signal. The satellite receiving circuits in the satellite communication circuit 21 receive a local oscillator signal from the dual mode synthesizer 34. This can be programmed in steps of 13 MHz divided by 64 multiplied by 65, according to the vernier loop principle. In contrast with the vernier loop principle disclosed in the previously cited Gardener publication, the synthesizer of the present invention has two outputs, one output from a first phase lock loop suitable for GSM communications and an output from a second phase lock loop suitable for the narrowband or satellite system. Since the telephone must switch between modes quickly in this transition phase between satellite operation and cellular operation, both loops must be able to switch frequencies relatively fast. By mixing with the synthesizer's second output, the satellite receiver circuits convert received signals to a first intermediate frequency of 156.4 MHz and then to a second intermediate frequency of 450 KHz by mixing with the 13 MHz reference frequency multiplied by 12. The satellite mode channel spacings in this mode are 13 MHz/64 multiplied by 65 which equals 3.125 KHz. The second intermediate frequency is hardlimited and processed to extract an RSSI signal which is approximately proportional to the logarithm of the signal amplitude of the second intermediate frequency. The hardlimited IF is further processed in the control and interface circuit 14 to extract signals which relate to an instantaneous signal phase. These signals are combined with the digitized RSSI signals from the AtoD converter 13 and passed to digital signal processing circuits 15 where they are processed to detect satellite signals. If satellite signals are detected and GSM signals are weak, the phone sends a deregistration message to the GSM system and/or a registration message to the satellite system. These aspects are described in U.S. patent application Ser. No. 08/179,958, entitled "Position Registration For Cellular Satellite Communication Systems", which is commonly assigned and incorporated herein by reference.

Upon deregistration from the GSM system, the GSM circuits in the phone are turned off or put into a deep sleep mode and the satellite receiver and relevant parts of the synthesizer are powered up to listen to the narrowband satellite control/paging channel. Preferably, this channel is also formatted in such a way that the receiver only needs to power up to receive a particular timeslot assigned for paging that mobile phone (sleep mode as opposed to deep sleep mode). This conserves battery power while the phone is in the idle mode, especially if fast synthesizer lock times from momentary power up can be achieved. Moreover, some of the spare time between paging slots in the satellite format can be devoted to scanning GSM frequencies so that the phone can determine when a GSM base station signal reappears, which would trigger a reversion back to the cellular mode. The cellular mode is a preferred mode since it is desirable to minimize the number of subscribers using the capacity-limited satellite system at any give time. As a result, only a small percentage of the phones, those that are temporarily outside the cellular coverage, represent a potential load on the capacity of the satellite system, so that the number of dual mode mobile phone subscribers can be many times greater than the capacity of the satellite system alone could support.

Because of the difficulty in obtaining a reference frequency oscillator of adequate stability, small size, and low cost for a portable phone, it is customary to utilize the base station signal as a reference signal and to lock the phone's internal reference frequency to the received base station signal by generating an automatic frequency control signal (AFC) as shown in FIG. 1 as "voltage control" from the D to A converter 13 to the reference oscillator 12.

The complexities that can arise due to Doppler shift in using the satellite signal as a reference signal are solved by the invention described in U.S. patent application Ser. No. 08/305,784, entitled "Frequency Error Correction In a Satellite-Mobile Communications System", which is hereby incorporated by reference. In the current invention, the AFC signal is derived from processing both the land-based network signals and the satellite transmitted signals.

The system described above is based on a 3.125 KHz channel-spacing satellite mode, although the present invention is not limited thereto. This is determined by the divider values of 65 and 64 in dividers 22 and 23. The first divider ratio arises due to GSM bitrates which are based on a 13 MHz reference clock which is 65 times the channel spacing. For a Vernier loop synthesizer, the second divider ratio is 1 away from the first divider, i.e., 64 or 66. The number 64 was selected in the present embodiment but is not limited thereto.

Figure 2:
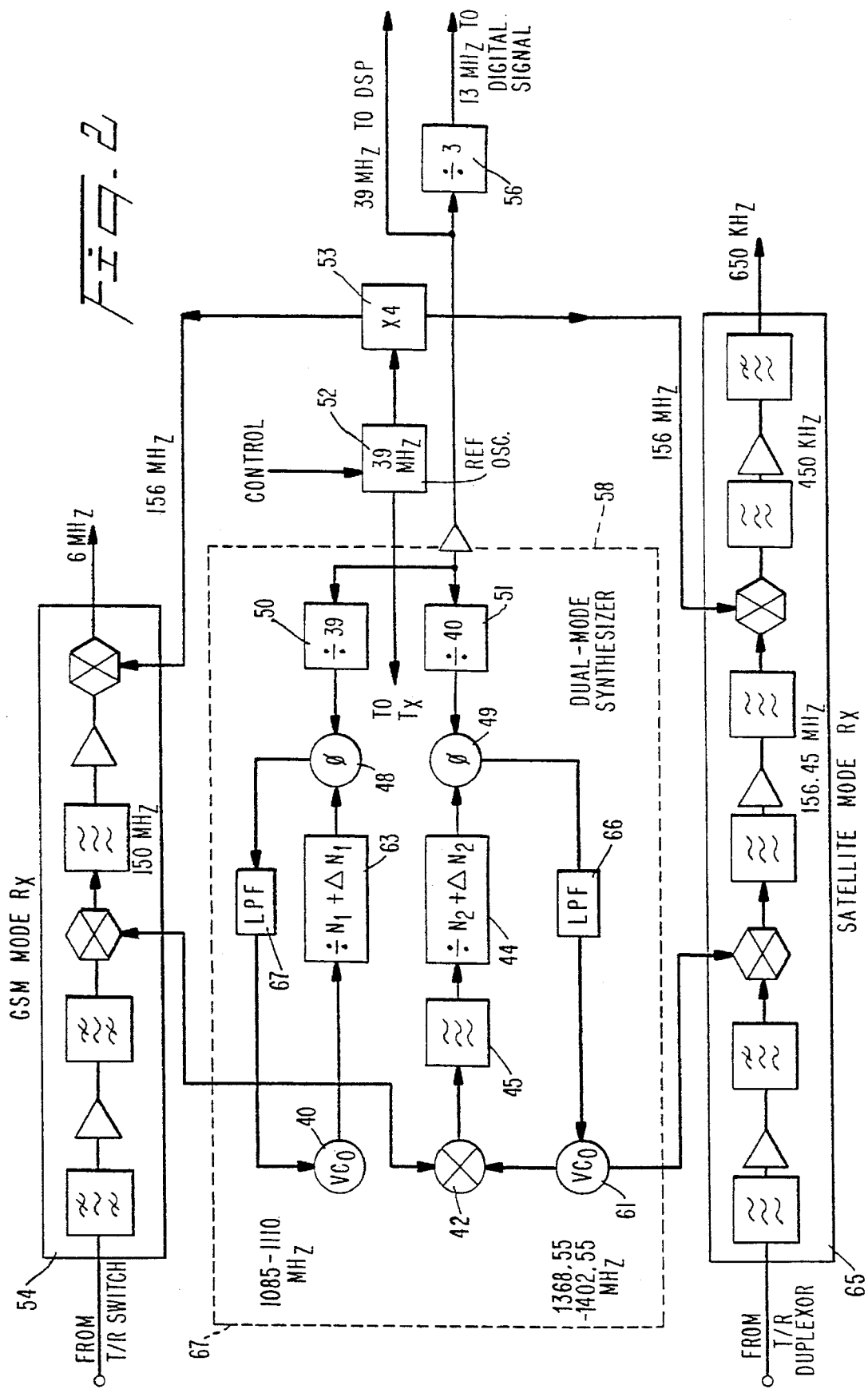
FIG. 2 illustrates a preferred arrangement of the dual mode receiver sections of one embodiment of the present invention.

It is also possible to configure the inventive dual-mode phone for 5 KHz satellite mode channel spacing. In this case a 39 MHz oscillator is used. This embodiment is illustrated in FIG. 2 where only details of the RF circuitry and synthesizer are shown. The baseband chips, i.e., the A to D converters 13, the control and interface circuit 14, and the digital signal processing circuits 15, remain as described above. The 39 MHz signal from the reference oscillator 52 is divided by 39 and 40 in digital dividers 50 and 51 respectively. The divider 50 thus produces a 1 MHz reference frequency for a phase comparator 48. The reference frequency is then filtered in a loop filter 47 before being applied to the VCO 40. The VCO 40 operates to produce a local oscillator signal suitable for the GSM mode which is then divided by N1+dN1 in a fractional-N divider 43 operating as disclosed in U.S. Pat. No. 5,180,993 which is incorporated herein by reference. The value dN1 can be controlled from 0 to ⅘ths in steps of ⅕th so that the VCO 40 is controlled to be N1+dN1 times 1 MHz in 200 KHz steps.

A second VCO 41 operates to generate a suitable local oscillator signal for the satellite mode. It is mixed down to the 280–300 MHz range against the output of the VCO 50 in a mixer 42 and then after being low-pass filtered in a filter 45 is divided in a divider 44 by N2+dN2 in steps of ⅕th. The divided output is compared in a phase detector 49 with the output of the divider 51 and the error signal from the phase detector 49 is filtered in a loop filter 46 before application to the control VCO 41 such that its frequency is (N2+dN2)39 MHz/40 +VCO 50 frequency. Thus the frequency of the VCO 51 is given by $$\left[ \frac{n1}{39 \times 5} + \frac{n2}{40 \times 5} \right] \times 39 \text{ MHz} =$$

$$\frac{5 \times 40 \times n1 + 5 \times 39 \times n2}{39 \times 5 \times 40 \times 5} \times 39 \text{ MHz} = 40n1 + 39n2 \times 5 \text{ KHz}$$

where n1=5(N1+dN1) and n2=5(N2+dN2). As a result, by varying the integers n1 and n2, the frequencies can be generated in 5 KHz steps as required for the postulated narrowband satellite mode. This desirable behavior is obtained by using a combination of fractional-N and Vernier Loop techniques to achieve both 200 KHz and 5 KHz steps simultaneously at respective cellular and satellite frequency bands. Both synthesizer loops operate with reference frequencies around 1 MHz and can have wide loop bandwidths to suppress phase and frequency noise and to achieve fast frequency switching times.

The output of the VCO 40 which is between 1085 MHz and 1110 MHz mixes with the GSM received signals in the bandwith of 935–960 MHz to generate a 150 MHz first intermediate frequency. This is chosen deliberately so that a second local oscillator signal of 156 MHz, which is used to convert the first IF to a second IF of 6 MHz, is a simple multiple of the 39 MHz reference frequency crystal, produced by the frequency multiplying circuit 53. Alternatively, it can be advantageous to use a 156 MHz crystal reference oscillator and instead to divide it down by 4 to generate the required 39 MHz. In addition, any frequency multiplying circuit can be implemented with the aid of either a harmonic generator plus a harmonic selection filter or, with the aid of a simple phase lock loop. These options are a matter of detailed design choice and all lie within the spirit of the inventive dual-mode phone. It is furthermore arranged for economy that the second local oscillator can also be used for the same purpose in the satellite receiver section.

The satellite receiver section 55 amplifies and filters the satellite received signal band of 1525–1559 MHz which is then mixed down against the output of the VCO 41 to generate a fixed IF of 156.45 MHz. This is further mixed down against the 156 MHz of the second IF to generate the final IF of 450 KHz. In addition, it is also possible to use the more standard 455 KHz by merely programming the satellite synthesizer one 5 KHz step lower in frequency and choosing the first IF to be 156.455 MHz. The final IF of either 6 MHz(GSM) or 450 KHz (satellite) is digitally processed as previously described. The digital processing can be supplied with a 13 MHz clock, from which all GSM bitrates and frame periods are derived, by dividing the 39 MHz reference frequency by 3 using the divider (56).

Figure 3:
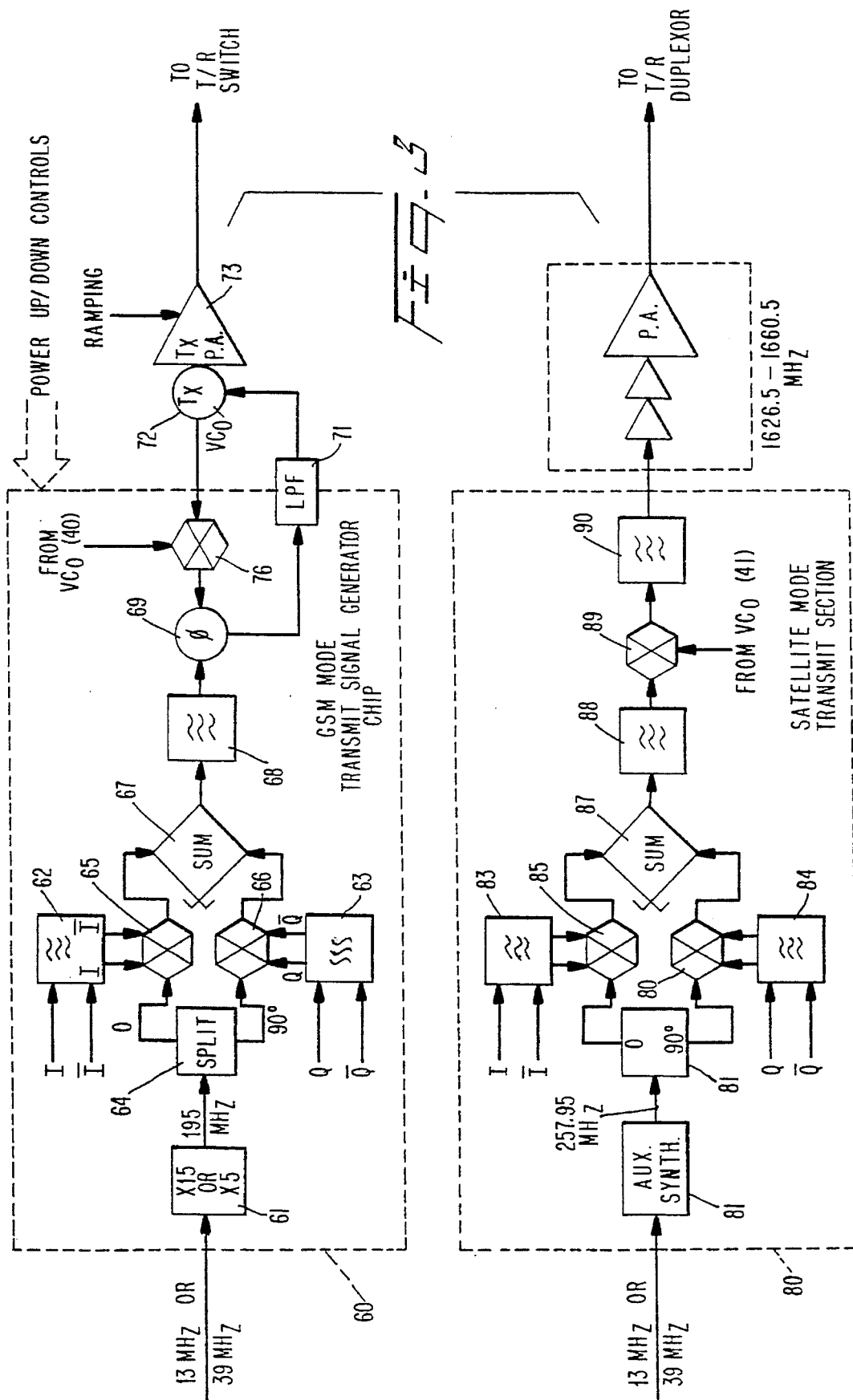
FIG. 3 illustrates the preferred arrangement of the dual mode transmitter sections according to one embodiment of the present invention.

The corresponding satellite and GSM mode transmit sections are illustrated in FIG. 3. In the GSM case, the transmitted frequency must lie at a frequency 45 MHz lower than the receive frequency and track with changes when the synthesizer is frequency-hopped. Thus, the transmit signal can be generated with the aid of a transmit IF that is 45 MHz higher than the received IF using the same high-side mixing frequency from the synthesizer. Consequently, a GSM transmit signal is first produced at an IF of 195 MHz which is a simple 5× multiple of the 39 MHz reference generated by a frequency multiplier 61. The 195 MHz signal is then split in a splitter 64 into COS and SIN components (or 0 and 90 degree phase shifted components) which drive the I and Q modulators 65 and 66. The quadrature modulator circuit composed of blocks 62–64 is known in the art, but various preferred refinements are further discussed in U.S. Pat. No. 5,530,722, entitled "Quadrature Modulator With Integrated Distributed RC Filters", which is hereby incorporated herein by reference.

In the GSM case, the GMSK modulation employed is a constant-envelope, i.e., purely a phase modulation. It is therefore necessary to only transfer the phase of the modulated 195 MHz signal to the output frequency rather than also transferring the amplitude variations. This can be accomplished with the aid of a phase transfer loop which is composed of elements 68–73 which are described below. The 195 MHz modulated signal is first low-pass filtered in a filter 68 to remove any harmonics produced in the modulators 65 and 66. The transmit frequency is generated by a VCO 72 which drives the transmit power amplifier 73. A portion of the VCO signal is mixed down to 195 MHz in a mixer 76 against the local oscillator signal from the synthesizer VCO 40. The resulting 195 MHz signal is phase-compared in a phase comparator 69 with the modulated 195 MHz signal from the filter 68 to produce a phase error signal. The phase error signal is then loop-filtered using an integrator 71 and applied to the control input of the VCO 72 to force its phase and frequency to track the phase modulation of the 195 MHz signal. As a result, the desired modulation is transferred to the VCO 72 operating at the transmit frequency. The phase transfer loop operates at a high loop bandwith because of a high phase comparison frequency which allows the loop to easily follow the desired modulation and locking from power-up in around 10 uS. Thus, the entire circuit may be powered up and down at the GSM TDMA frame rate so that power is only consumed during the transmit slot.

The satellite transmit section 80 can of course also use the same principles as the GSM transmit section, if constant envelope modulation is chosen for the satellite mode. For the purposes of illustrating the versatility of the present invention however, block 80 has been configured to the generation of linear modulation that has both amplitude and phase variations that must be reproduced on the transmitter output. In the present embodiment, the transmit IF at which a modulation signal is first generated does not need to be a multiple of the synthesizer circuit 81. This is the case when the satellite mode is frequency-duplexed and uses the 101.5 MHz transmit-receive frequency spacing of INMARSAT satellites. The transmit IF then employed is 257.95 MHz. This is so close to the 20×13 MHz that it is possible to use 260 MHz providing the frequency of the synthesizer VCO 41 is sidestepped 2.05 MHz for transmission. This is only possible if a time-duplex mode is chosen for the satellite so that the local oscilator, i.e., the synthesizer output, does not simultaneously have to be used for transmit and receive, but rather used alternately.

For linear modulation, both amplitude and phase variations of the signals are translated up from 257.95 MHz to the transmit band of 1626.5–1660.5 MHz by a straight upconversion process using a mixer 89 and a bandpass filter 90 to suppress the undesired lower mixing product.

The above described inventive dual-mode satellite/cellular phone simultaneously accomplishes the implementation of two completely unrelated communications standards and protocols with considerable sharing of components in both the baseband processing section and in the RF section, particularly the synthesizer section. This is the result of the novel configuration of the synthesizer using a combination of both fractional-N and vernier loop techniques to simultaneously generate frequencies in two different frequency bands with wide and narrow channel spacings respectively. The general principle of constructing such a synthesizer will now be described below in conjunction with FIG. 4.

Figure 4:
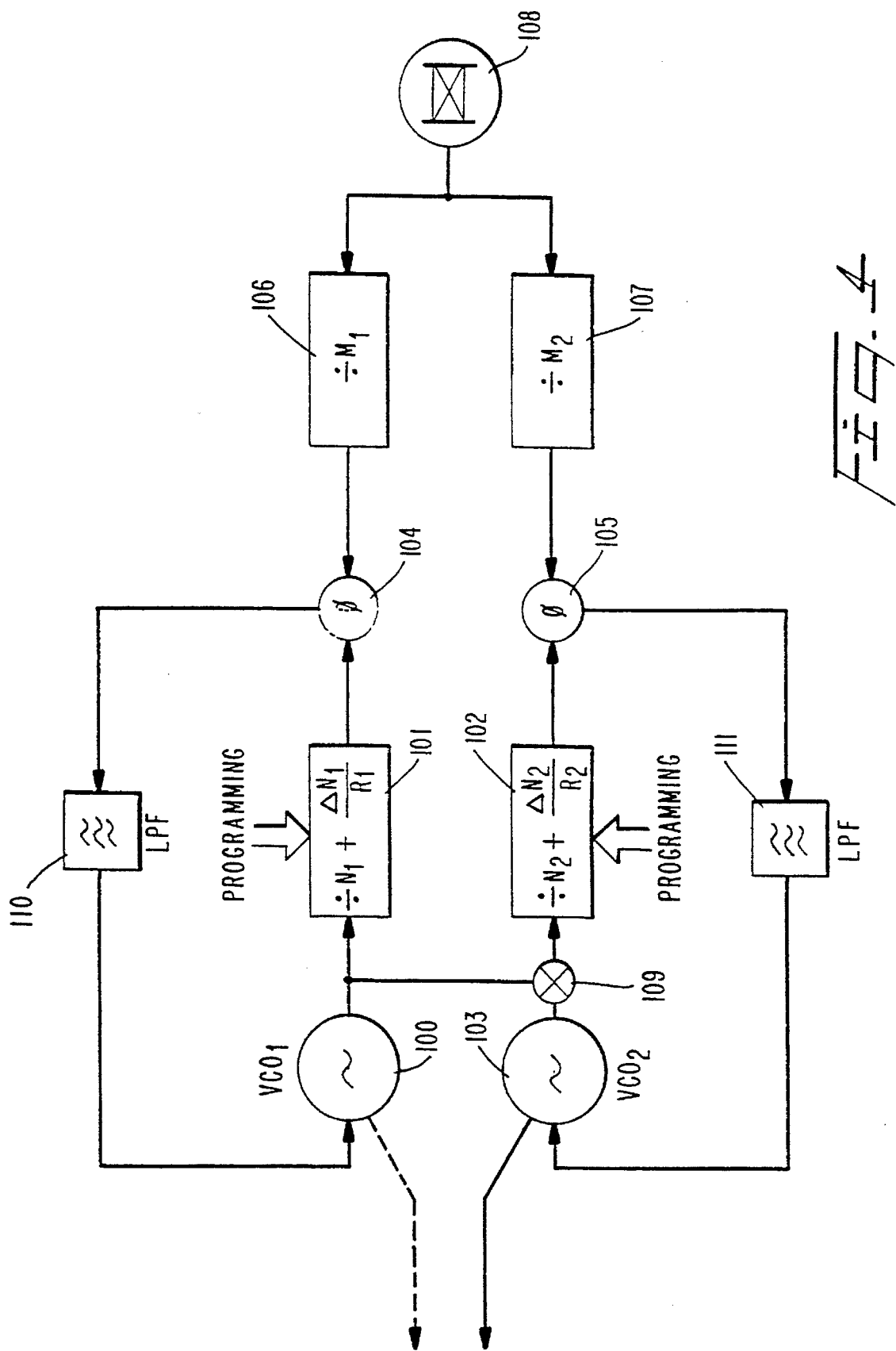
FIG. 4 illustrates a dual loop synthesizer according to one embodiment of the present invention.

FIG. 4 illustrates a first Voltage Controlled Oscillator 100 (or a Current Controlled Oscillator) controlled in frequency by the output signal from a loop filter (110). The loop filter has a broadly low-pass frequency response which includes an output component proportional to the integral of the input signal plus an output component proportional to the input signal. U.S. Pat. No. 5, 095,288 discloses how the integral and proportional components can be independently controlled during frequency changes so as to accelerate transient settling of the loop. This patent is expressly incorporated herein by reference and represents a preferred construction of the phase detectors 104 and 105 and loop filters 110 and 111. The frequency of the VCO 100 is divided using a fractional-N divider 101 by the programmable quantity N1+dN1/R1 where N1, dN1, and R1 are integers. R1 is generally a fixed radix, for example 10, and N1 represents the whole part of the division ratio and dN1 represents the fractional part, i.e. tenths if R1=10. The fractional division ratio is, for example, created by dividing by N1 for 1−dN1/R1 of the time and by N1+1 for dN1/R1 of the time, although other methods are known in the prior art and the present invention is not limited thereto. Approximating a fractional pan by switching between adjacent integers in this way results in a sawtooth error component or phase jitter, which all fractional-N techniques seek to compensate in some way so as to avoid the jitter modulating the VCO frequency and causing unwanted spectral sidebands. U.S. Pat. No. 5,180,993 describer a suitable technique that is compatible with the preferred embodiment of the phase comparator and loop ffiter disclosed in the U.S. Pat. No. 5,095,288 and is incorporated herein by reference. The exact technique of fractional-N employed for the current invention is however not material to the invention and use of any techniques which allows a synthesizer to generate frequencies in programmable increments that are smaller than the phase comparator's reference frequency are considered as falling within the scope and spirit of the present invention.

The phase comparator 104 is provided with a reference frequency for comparison with the fractional-divider output by dividing the output of a crystal reference oscillator 108 by M1 in a reference divider 106. When the loop has settled from a transient change to the programming of N1 or dN1, the VCO frequency f1 will attain the value N1+dN1/R1 multiplied by the crystal frequency Fref divided by M1 as illustrated below:

$$f1 = (N1 + dN1/R1) \cdot Fref/M1 = (R1 \cdot N1 + dN1) \cdot \frac{Fref}{M1 \cdot R1}$$

A second VCO 103 operates at a frequency f2 which is mixed with the frequency f1 from the VCO 100 in a mixer 109 to produce either a sum or difference frequency or both. In general, the difference frequency is more desirable and can be selected with the aid of a low pass filter which is not illustrated. The difference frequency f2−f1 is then divided in a second fractional divider 102 by N2+dN2/R2 in the same manner as performed in the divider 101. The phase detector 105 then compares the result with the crystal frequency divided by M2 which is produced by a reference divider 107 and feeds a control signal back to the VCO 103 such that the difference frequency f2−f1 (or f1−f2) is controlled so as to equal $$f2 - f1 = (R2 \cdot N2 + dn2) \cdot \frac{Fref}{M2 \cdot R2}$$

Thus $$f2 = f1 + (R2 \cdot N2 + dN2) \cdot \frac{Fref}{M2 \cdot R2} =$$

$$\left[ \frac{(R1 \cdot N1 + dN1)}{M1 \cdot R1} + \frac{(R2 \cdot N2 + dN2)}{M2 \cdot R2} \right] \cdot Fref$$

Letting $R1 \cdot N1 + dN1 = n1$ and $R2 \cdot N2 + dN2 = n2$, $$f2 = (M2 \cdot R2 \cdot n1 + M1 \cdot R1 \cdot n2) \cdot \frac{Fref}{N1 \cdot R1 \cdot M2 \cdot R2}$$

Thus by choosing n1 and n2 (i.e. programming all bits of N1, dN1, N2 and dN2) such that M2·R2·n1+M1·R1·n2 increments in steps of one, the frequency is controlled in steps of the crystal frequency divided by M1·R1·M2·R2 For example, suppose M2·51, R2=5, M2·R2=255 and M1=32, R1=8, M1·R1=256 Then f2=(256·n2+255·n1) Fref/(255× 256) Choosing Fref=6.528 MHz for example allows f2 to be programmed in 100 Hz steps while the phase comparators operate at reference frequencies of 204 KHz and 128 KHz respectively.

It is well known how to decompose a desired multiple N of 100 Hz given by 256·n2+255·n1 into integers n1 and n2. If N is expressed in binary form, then n1 will simply be the two's component of the least significant 8-bit byte, and n2 will be the remaining most significant byte or bytes minus n2 plus 1. This imposes the known limitation that, since n2 cannot be negative, the most significant byte(s) of the desired frequency must be at least equal to the highest value of n1−1. This lower frequency limit is on the order of the crystal frequency, but this is not a problem when the objective of the synthesizer is to generate frequencies much higher than the crystal frequency. It is not necessary for M2·R2 and M1·R1 to differ by only 1. However, they should preferably be mutually prime.

A particular situation arises when M1=M2. In this case, the two reference dividers 106 and 107 can be simplified into a single reference divider M. Then the expression for f2 becomes:

$$f2 = (R2 \cdot n1 + R1 \cdot n2) \cdot \frac{Fref}{M \cdot R1 \cdot R2}$$

For example, if R2=4 and R1=5, frequency steps of 1/20th of the phase comparator reference frequency FreffM can be programmed. It is also possible to choose R2=8 and R1=5. Then, R2·n1+R1·n2 can be stepped in increments of one from a starting point n1, n2 by means of the sequence:

```
No = 8n1 + 5n2
No + 1 = 8(n1 − 3) + 5(n2 + 5)
No + 2 = 8(n1 − 6) + 5(n2 + 10)
. . .
No + 4 = 8(n1 − 12) + 5(n2 + 20)
No + 5 = 8n1 + 5(n2 + 1)
No + 6 = 8(n1 − 3) + 5(n2 + 1 + 5)
No + 7 = 8(n1 − 6) + 5(n2 + 1 + 10)
No + 8 = 8(n1 + 1) + 5n2
No + 9 = 8(n1 + 1 − 3) + 5(n2 + 5)
etc.
```

Thus, a possible implementation of the present invention to generate GSM steps of 200 KHz and satellite-mode steps of 5 KHz is to operate with a Fref=13 Mhz, M1=65 so that the loop comprising VCO 100 gives 200 KHz steps without fractional-N interpolation but with R1=5 in the satellite mode combined with fractional-N interpolation with R2=8 in the second loop comprising VCO 103. Thus in the satellite mode, the steps will be 200 KHz/(5×8) which equals 5 KHz.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather then the foregoing description, and all changes which come within the meaning and range of equivalence thereof are intended to be embraced therein.

What is claimed is:

1. A frequency synthesizer for providing a first output signal programmable over a first frequency band in first frequency steps and a second output signal programmable over a second frequency band in second frequency steps, comprising;

first reference divider means for dividing a reference frequency by a first integer to produce a first comparison frequency;

second reference divider means for dividing said reference frequency by a second integer to produce a second comparison frequency;

first controlled oscillator means for producing a first output frequency and having an input for a first frequency control signal;

first fractional-N divider means for dividing said first output frequency by a first programmable quantity having both a first integer part and a first fractional part to produce a first loop frequency;

first phase and frequency comparator means for comparing said first loop frequency with said first comparison frequency to produce a first error signal;

first loop filter means for processing said first error signal to obtain said first frequency control signal;

second controlled oscillator means for producing a second output frequency and having an input for a second frequency control signal;

mixing means for generating a difference frequency signal having inputs from said first and second controlled oscillator means;

second fractional-N divider means for dividing said difference frequency by a second programmable quantity having a second integer part and a second fractional part to produce a second loop frequency;

second phase and frequency comparator means for comparing said second loop frequency with said second comparison frequency to produce a second error signal;

second loop filter means for processing said second error signal to obtain said second frequency control signal.

2. The frequency synthesizer device as in claim 1, wherein said first fractional part of said first fractional-N divider means is the ratio of a third integer over a fourth integer and said second fractional part of said second fractional-N divider means is the ratio of a fifth integer over a sixth integer.

3. The frequency synthesizer according to claim 2, wherein said fourth and sixth integers are mutually prime.

4. The frequency synthesizer according to claim 1, wherein said first and second integers are mutually prime.

5. The frequency synthesizer according to claim 2, wherein a product of said first and fourth integers is mutually prime from a product of said second and sixth integers.

6. The frequency synthesizer according to claim 2, wherein a product of said first and fourth integers is mutually prime to a product of said second and sixth integers and said products differ by one.

7. The frequency synthesizer according to claim 2, wherein said first and second integers are equal and said first and second reference divider means are the same means.

8. The frequency synthesizer according to claim 7, wherein said fourth and sixth integers are mutually prime.

9. The frequency synthesizer according to claim 8, wherein said fourth and sixth integers differ by one.

10. The frequency synthesizer according to claim 1, wherein a dual-mode portable radio/telephone is used to provide in a first mode transmission or reception of any one of a number of channels spaced with a first channel spacing or to provide in a second mode transmission or reception of any one of a second number of channels spaced with a second channel spacing.

11. The device according to claim 10, wherein said second channel spacing is a sub-multiple of said first channel spacing.

12. The device according to claim 10, wherein a signal from a land-based network is received during a short Time Division Multiple Access timeslot and processed by a numerical processing and a signal from a satellite system is received between said Time Division Multiple Access timeslots and processed by the numerical processing.

13. The device according to claim 12, wherein said processing evaluates a signal strength measurement.

14. The device according to claim 12, wherein said processing calculates a frequency error.

* * * * *